(12) United States Patent
Chen et al.

(10) Patent No.: US 10,921,279 B2
(45) Date of Patent: Feb. 16, 2021

(54) FABRICATION OF HIGH ASPECT RATIO TALL FREE STANDING POSTS USING CARBON-NANOTUBE (CNT) TEMPLATED MICROFABRICATION

(71) Applicant: BRIGHAM YOUNG UNIVERSITY, Provo, UT (US)

(72) Inventors: Guohai Chen, Provo, UT (US); Robert C. Davis, Provo, UT (US); Richard Vanfleet, Provo, UT (US)

(73) Assignee: Brigham Young University, Provo, UT (US)

(*) Notice: Subject to any disclaimer, the term of this patent is extended or adjusted under 35 U.S.C. 154(b) by 441 days.

(21) Appl. No.: 15/299,386

(22) Filed: Oct. 20, 2016

(65) Prior Publication Data

US 2017/0108462 A1    Apr. 20, 2017

Related U.S. Application Data

(60) Provisional application No. 62/244,145, filed on Oct. 20, 2015.

(51) Int. Cl.
| | | |
|---|---|---|
| G01N 27/327 | (2006.01) | |
| G01N 27/28 | (2006.01) | |
| G01N 33/94 | (2006.01) | |
| C01B 32/16 | (2017.01) | |
| B81C 1/00 | (2006.01) | |
| B81C 99/00 | (2010.01) | |
| B01L 3/00 | (2006.01) | |
| B82Y 15/00 | (2011.01) | |
| B82Y 40/00 | (2011.01) | |

(52) U.S. Cl.
CPC ...... *G01N 27/3277* (2013.01); *B81C 1/00111* (2013.01); *B81C 99/0085* (2013.01); *C01B 32/16* (2017.08); *B01L 3/5088* (2013.01); *B82Y 15/00* (2013.01); *B82Y 40/00* (2013.01); *G01N 27/3278* (2013.01); *Y10S 977/742* (2013.01); *Y10S 977/893* (2013.01); *Y10S 977/92* (2013.01)

(58) Field of Classification Search
CPC .......... G01N 33/4836; G01N 33/9413; G01N 27/283; A61B 2562/0285; A61B 2562/066; A61B 2562/046; A61B 2562/125; B82Y 15/00; B82Y 40/00; C01B 31/02; Y10S 977/742; Y10S 977/893; Y10S 977/92

See application file for complete search history.

(56) References Cited

U.S. PATENT DOCUMENTS

| | | |
|---|---|---|
| 7,756,251 B2 | 7/2010 | Davis et al. |
| 8,736,138 B2 | 5/2014 | Hutchison et al. |
| 9,164,068 B2 | 10/2015 | Linford et al. |
| 9,181,639 B2 * | 11/2015 | Hart .......................... B82B 1/00 |

(Continued)

OTHER PUBLICATIONS

International Search Report and Written Opinion for PCT Application PCT/US2016/057989, dated Jan. 31, 2017, 10 pages.

*Primary Examiner* — Gurpreet Kaur
(74) *Attorney, Agent, or Firm* — Brake Hughes Bellermann LLP

(57) ABSTRACT

In a general aspect, an apparatus can include a substrate and a post disposed on the substrate. The post can include a plurality of nanotubes and extend substantially vertically from the substrate. The post can have an aspect ratio of a height of the post to a diameter of the post of greater than or equal to 25:1.

20 Claims, 16 Drawing Sheets

(56) References Cited

U.S. PATENT DOCUMENTS

| | | |
|---|---|---|
| 9,217,734 B2 | 12/2015 | Linford et al. |
| 9,283,541 B2 | 3/2016 | Song et al. |
| 2001/0019238 A1 | 9/2001 | Dai et al. |
| 2007/0259128 A1 | 11/2007 | Parsapour et al. |
| 2009/0183770 A1 | 7/2009 | Nguyen et al. |
| 2010/0285271 A1* | 11/2010 | Davis .................. H01J 5/18 428/131 |
| 2010/0327444 A1* | 12/2010 | Kondo .................. B82Y 30/00 257/746 |
| 2011/0008617 A1 | 1/2011 | Hata et al. |
| 2012/0202347 A1 | 8/2012 | Ready et al. |
| 2013/0112610 A1 | 5/2013 | Davis et al. |
| 2013/0285160 A1 | 10/2013 | Davis et al. |

* cited by examiner

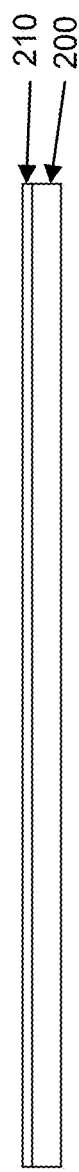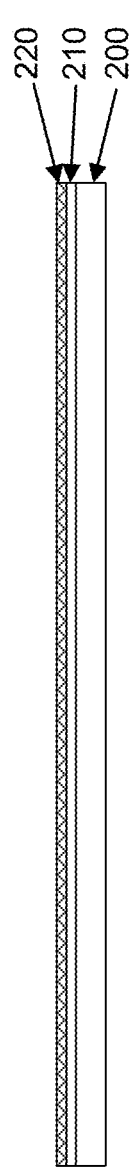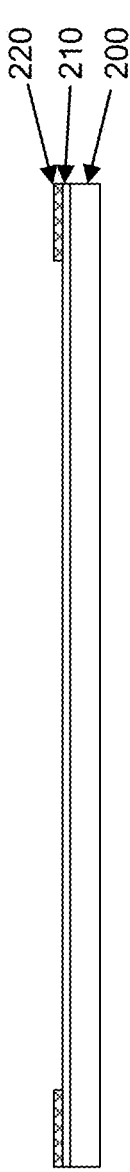

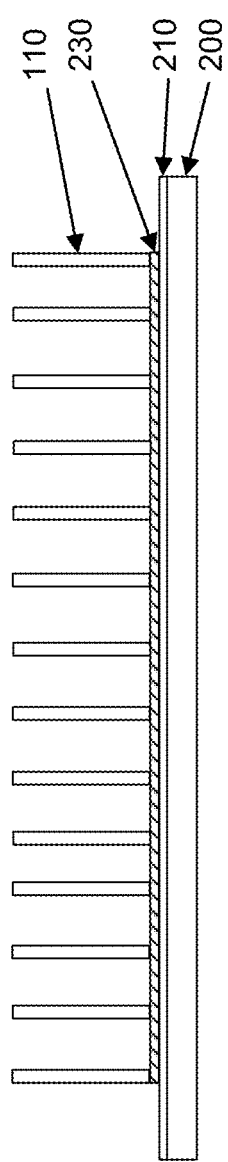

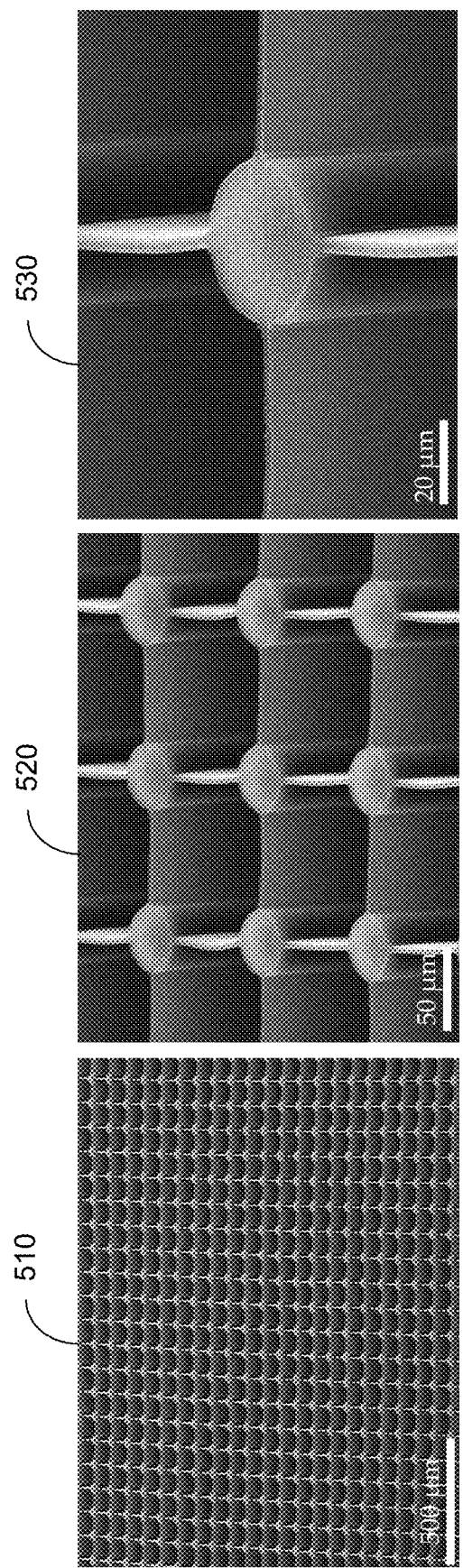

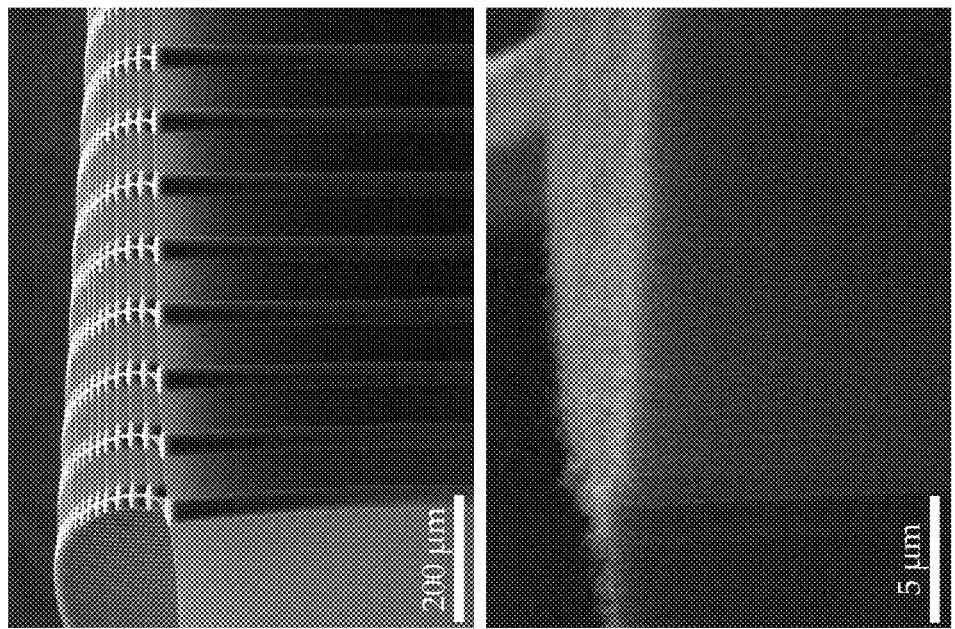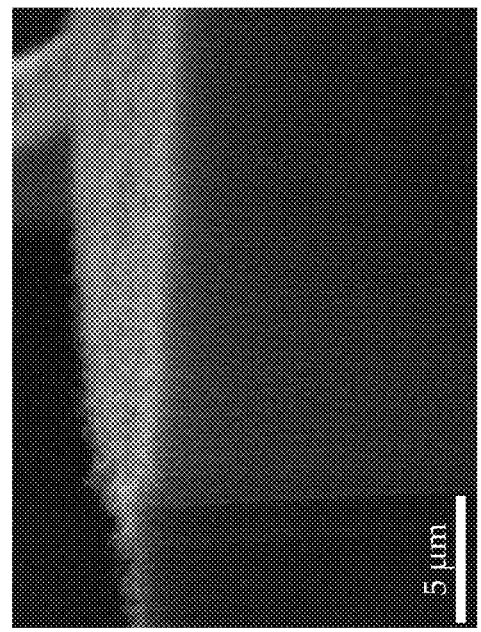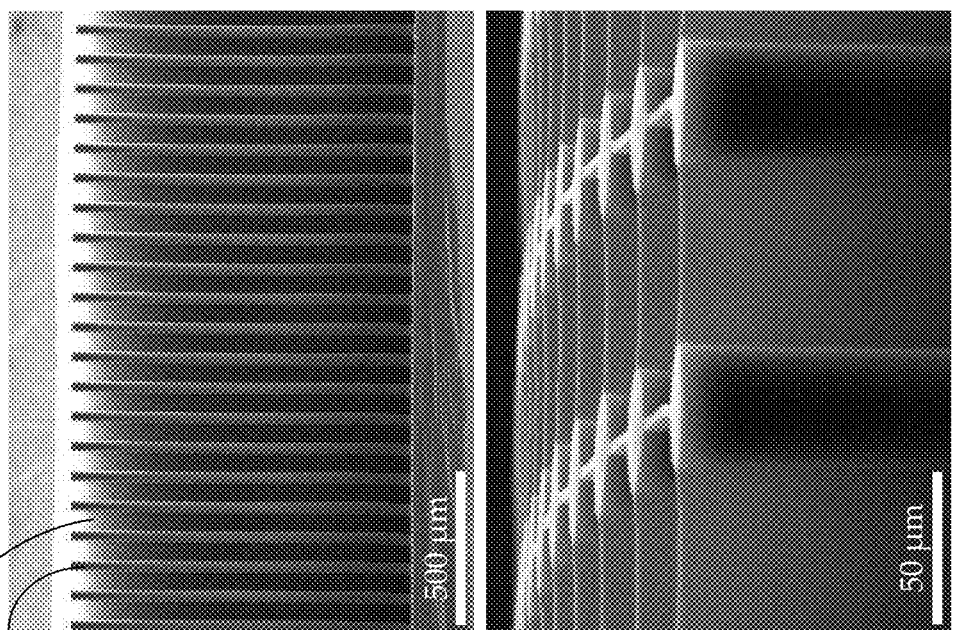

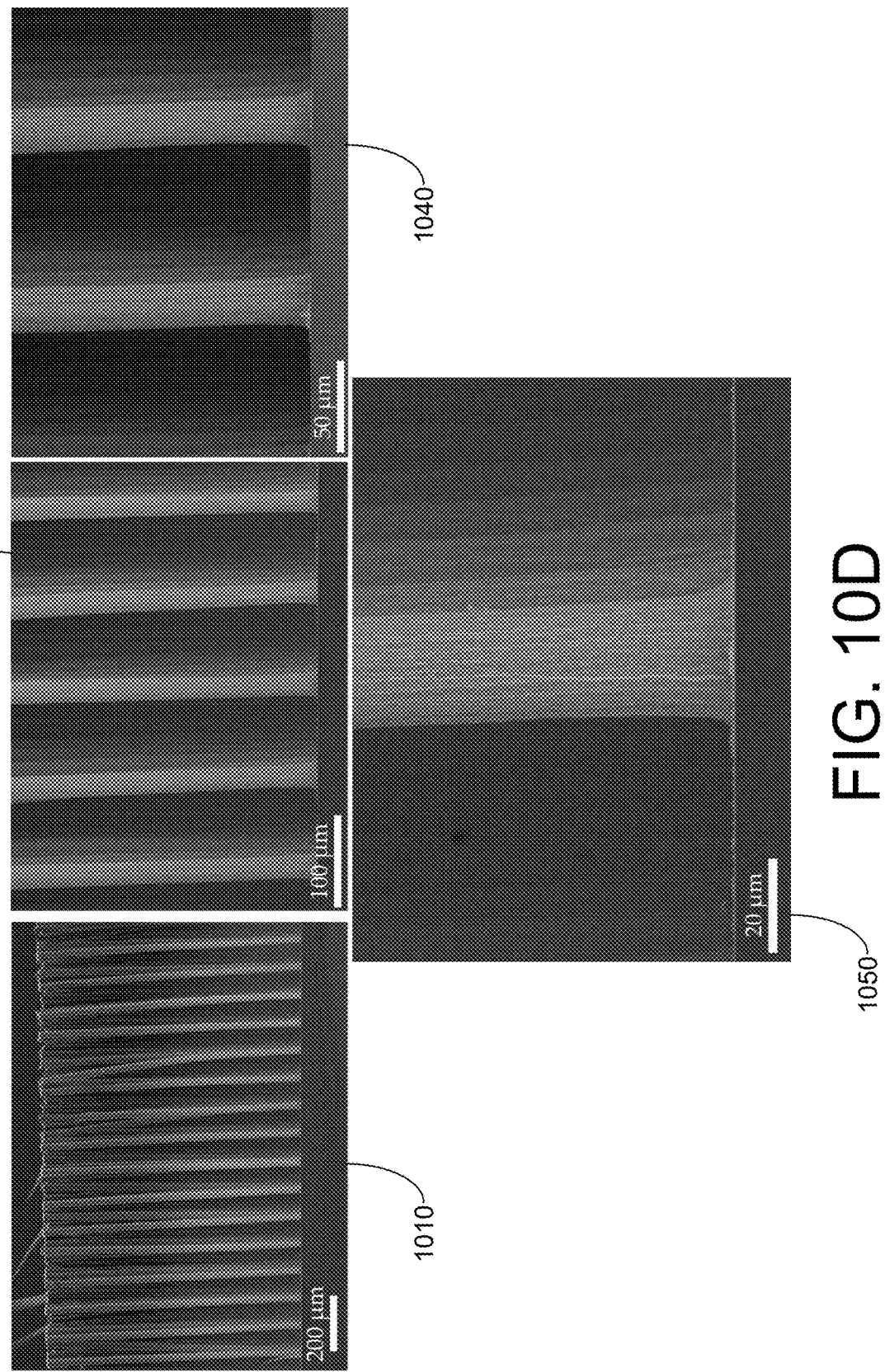

FABRICATION OF HIGH ASPECT RATIO TALL FREE STANDING POSTS USING CARBON-NANOTUBE (CNT) TEMPLATED MICROFABRICATION

CROSS-REFERENCE TO RELATED APPLICATIONS

This application is a Non-provisional of, and claims priority to, U.S. Provisional Patent Application No. 62/244,145, filed on Oct. 20, 2015, entitled "Fabrication of High Aspect Ratio Tall Free Standing Posts Using Carbon-Nanotube (CNT) Templated Microfabrication", which is incorporated by reference herein in its entirety.

TECHNICAL FIELD

This description relates to the fabrication of high aspect ratio tall free standing posts using carbon-nanotube (CNT) templated microfabrication with subsequent plasma etching.

SUMMARY

In a general aspect, an apparatus can include a substrate and a post disposed on the substrate. The post can include a plurality of nanotubes and extend substantially vertically from the substrate. The post can have an aspect ratio of a height of the post to a diameter of the post of greater than or equal to 25:1.

Implementations can include one more of the following features. For example, the diameter of the post can be in a range of 5 micrometers (μm) to 100 μm. The post can be substantially cylindrical. The height of the post can be greater than or equal to 1 millimeter (mm).

The plurality of nanotubes can include a plurality of carbon nanotubes (CNTs). At least a portion of the plurality of nanotubes of the post can be infiltrated with carbon (C). At least a portion of the plurality of nanotubes of the post can be infiltrated with at least one of silicon (Si) and silicon nitride (SiN). At least a portion of the plurality of nanotubes of the post can be plated with a metal.

The post can be a first post and the apparatus can include a second post disposed on the substrate and laterally spaced from the first post, the second post including a plurality of nanotubes and extending substantially vertically from the substrate, the second post having an aspect ratio of a height of the second post to a diameter of the second post of greater than or equal to 25:1.

The substrate can include a silicon (Si) wafer having an aluminum oxide ($Al_2O_3$) layer disposed thereon. The substrate can include a glass substrate or a metal substrate.

In another general aspect, a method can include providing a substrate and forming a patterned catalyst layer on the substrate. The patterned catalyst layer can define a template for carbon nanotube growth. The template can define a pattern for formation of a first carbon nanotube post, a second carbon nanotube post and a supporting structure disposed between the first carbon nanotube post and the second carbon nanotube post. The method can further include growing carbon nanotubes on the patterned catalyst layer to form the first carbon nanotube post, the second carbon nanotube post and the supporting structure. The first carbon nanotube post and the second carbon nanotube post can each have an aspect ratio of a height to a diameter of greater than or equal to 25:1. The supporting structure can have an aspect ratio of a height to a width of greater than or equal to 200:1. The method can further include removing the supporting structure, such that each of the first carbon nanotube post and the second carbon nanotube post are freestanding and extend substantially vertically from the substrate.

Implementations can include one more of the following features. For example, prior to removal of the supporting structure, a height of the first carbon nanotube post, a height of the second carbon nanotube post and a height of the supporting structure can be substantially a same height. The same height can be greater than or equal to 1 millimeter (mm).

The method can include infiltrating the first carbon nanotube post and the second carbon nanotube post with carbon (C). The method can include infiltrating the first carbon nanotube post and the second carbon nanotube post with at least one of silicon (Si) and silicon nitride (SiN). The method can include plating the first carbon nanotube post and the second carbon nanotube post with a metal.

Removing the supporting structure can include performing a non-directional plasma etch to remove an upper portion of the supporting structure, such that a lower portion of the supporting structure remains, the lower portion of the supporting structure being disposed on the substrate; infiltrating the first carbon nanotube post, the second carbon nanotube post and the lower portion of the supporting structure with carbon (C); and performing a directional plasma etch to remove the lower portion of the supporting structure.

The substrate can include a Si wafer having an $Al_2O_3$ layer disposed thereon. The patterned catalyst layer can be formed on the $Al_2O_3$ layer. Forming the patterned catalyst layer can include forming, using photolithography, a patterned iron (Fe) layer, the $Al_2O_3$ layer preventing diffusion of the patterned Fe layer into the Si wafer. The substrate can include a metal substrate or a glass substrate.

In another general aspect, an apparatus can include a substrate and an array of carbon nanotube posts disposed on the substrate. Each carbon nanotube post of the array of carbon nanotube posts can include a plurality of nanotubes and can extend substantially vertically from the substrate. Each carbon nanotube post of the array of carbon nanotube posts can have an aspect ratio of a height of the post to a diameter of the post of greater than or equal to 25:1.

BRIEF DESCRIPTION OF THE DRAWINGS

FIGS. 2A through 2G are cross-sections illustrating a processing flow for producing high aspect ratio CNTs, according to an implementation.

FIGS. 5A through 5C are images that illustrate perspective views of tall CNT structures formed using supporting structures, according to implementations.

FIGS. 6A through 6D are images that illustrate side views of tall CNT structures formed using supporting structures, according to implementations.

FIGS. 10A through 10D are scanning electron microscope (SEM) images that illustrate side-views of free standing CNT posts after removing the CNT supporting structures, according to implementations.

Like reference symbols in the various drawings may indicate like and/or similar elements.

DETAILED DESCRIPTION

The fabrication of high aspect ratio tall free standing posts (e.g., post arrays) can be produced using Carbon Nanotube (CNT) templated microfabrication with a sacrificial supporting structure. Carbon-nanotube-templated microfabrication (CNT-M) can be used to form precise high aspect ratio features in, for example, interconnected geometries. The feature of fabrication of isolated posts can be challenging, however. In some implementations, a CNT shape, when grown in, for example, forests (e.g., a dense collection of CNT structures), can be used to produce, for example, three dimensional (3D) complex structures. In some implementations, if those structures are relatively tall and relatively thin (have a high aspect ratio), the structures can lose at least some aspects of the important vertical nature of the growth (e.g., bend, break, tip, etc.). The implementations described herein can enable the retention of the vertical structure for very tall features. In some implementations, CNT members (e.g., needles) of, for example, ~10-40 micrometers ($\mu m$) in diameter can be grown to, for example, millimeter heights. In implementations, such CNT members can have a range of spacing between them (e.g., lateral spacing on the substrate), such as 100-400 $\mu m$ center-to-center spacing. Depending on the implementation (and the particular CNT structures being produced) the spacing could be less than 100 $\mu m$ center-to-center or greater than 400 $\mu m$ center-to-center.

A process is described herein that includes fabrication of CNT posts connected by supporting structures using, for example, CNT-M techniques followed by plasma etching (e.g., oxygen plasma etching) to remove the sacrificial supporting structures. The fabrication of posts can be achieved with diameters from, for example, 10-40 um and heights up to, for example, 1.3 mm using sacrificial supporting structures of, for example, 1-5 um in width, with spacing such as those discussed above. With the CNT template, isolated free standing posts from a variety of materials can be made. For example, silicon or silicon nitride posts can be fabricated by infiltration with silicon or silicon nitride. In some implementations, the creation of hybrid carbon/metal (copper, nickel) posts can also be realized through pulse electroplating.

Figures 5D, 5E, 5F:
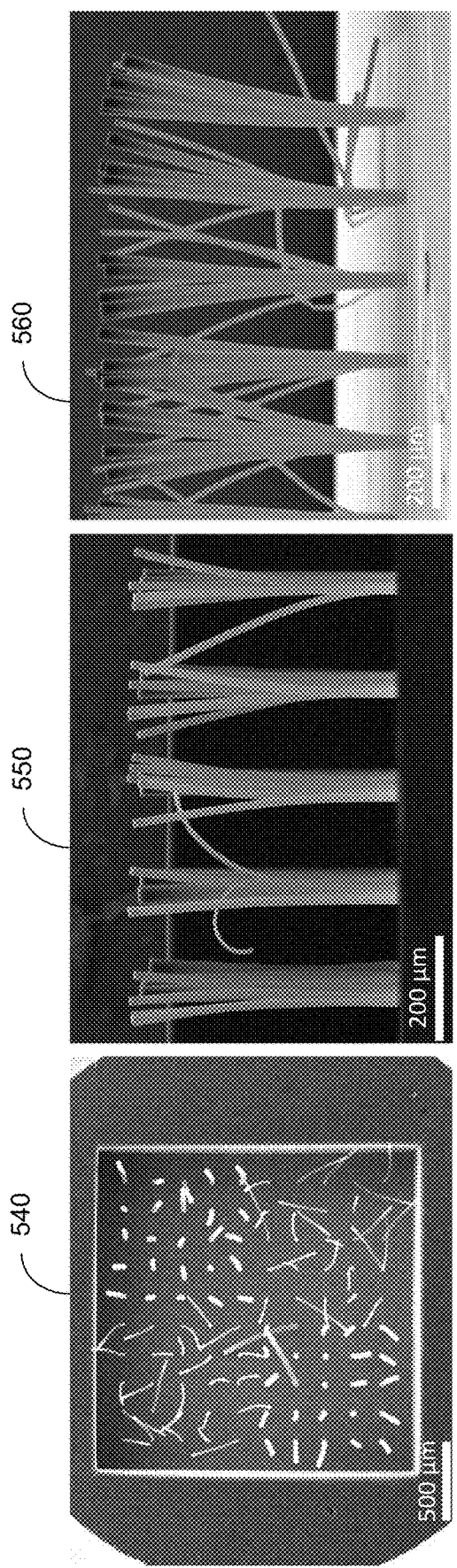
FIGS. 5D through 5F are images that illustrate tall CNT structures formed without the use of supporting structures.

Low aspect ratio carbon nanotube (CNT) posts (also can be referred to as members) can be produced using direct growth techniques. However, as noted above, direct growth of high aspect ratio CNT posts can be challenging, or impossible to achieve. High aspect ratio CNT posts formed using direct growth techniques can bend in random directions (break, tip, etc.) as they grow tall depending on the aspect ratio. Examples of such occurrences are shown in FIGS. 5D-5F. Free standing CNT post arrays can be important for developing CNTs devices and for integrating them with conventional microelectronics in many research fields.

Figure 1:
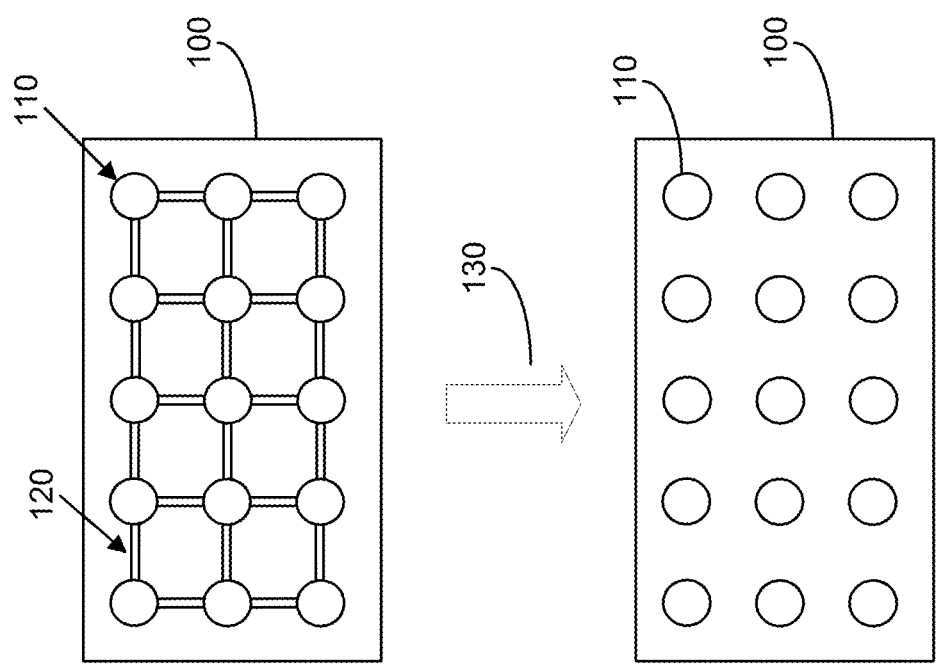
FIG. 1 is a diagram that schematically illustrates a method for producing high aspect ratio carbon nanotubes (CNTs), according to an implementation.

FIG. 1 is a diagram that schematically illustrates a method for producing high aspect ratio carbon nanotubes (CNTs), according to an implementation. FIG. 1 illustrates the addition of supporting structures (supporting hedges, etc.) 120 to support the growth of CNT posts 100 in a CNT-M structure. As shown, in FIG. 1 the CNT posts 110 and supporting structures 120 can be formed on a substrate 100. After forming the CNT-M structure including the CNT posts 110 and the supporting structures 120, processing 130 can be performed to remove the supporting structures 120, resulting in an array of free standing, high aspect ratio (e.g., with a height to diameter ratio greater than or equal to 25:1) CNT posts 110 disposed on the substrate 100. The free standing CNT posts can be 1 millimeter (mm) or greater in height. While example approaches for producing structures such as the, free-standing CNT posts 110 shown in FIG. 1, the following briefly describes aspects of such processes.

In some implementations, straight (substantially straight, vertical, substantially vertical, and so forth) millimeter-tall CNT posts (e.g., CNT posts 110) with diameters of, for example, 10-40 $\mu m$ or 5-100 $\mu m$ can be grown using supporting CNT structures (e.g. supporting structures 120). For instance, CNT posts can be grown where a vertical line through a center of a cross-section of one end of the CNT post would intersect a cross-section take at an opposite end of the CNT post. While the CNT posts 110 are illustrated as being cylindrical in cross-section, in other implementations CNT posts (or other tall, vertical CNT structures) having other cross-sectional geometries (e.g., square, triangle, hexagon, or other shape) can be produced using the approaches described herein. Further, the final geometries of a given CNT structure can affected by the removal (e.g., etching) of associated supporting structures.

Figure 7:
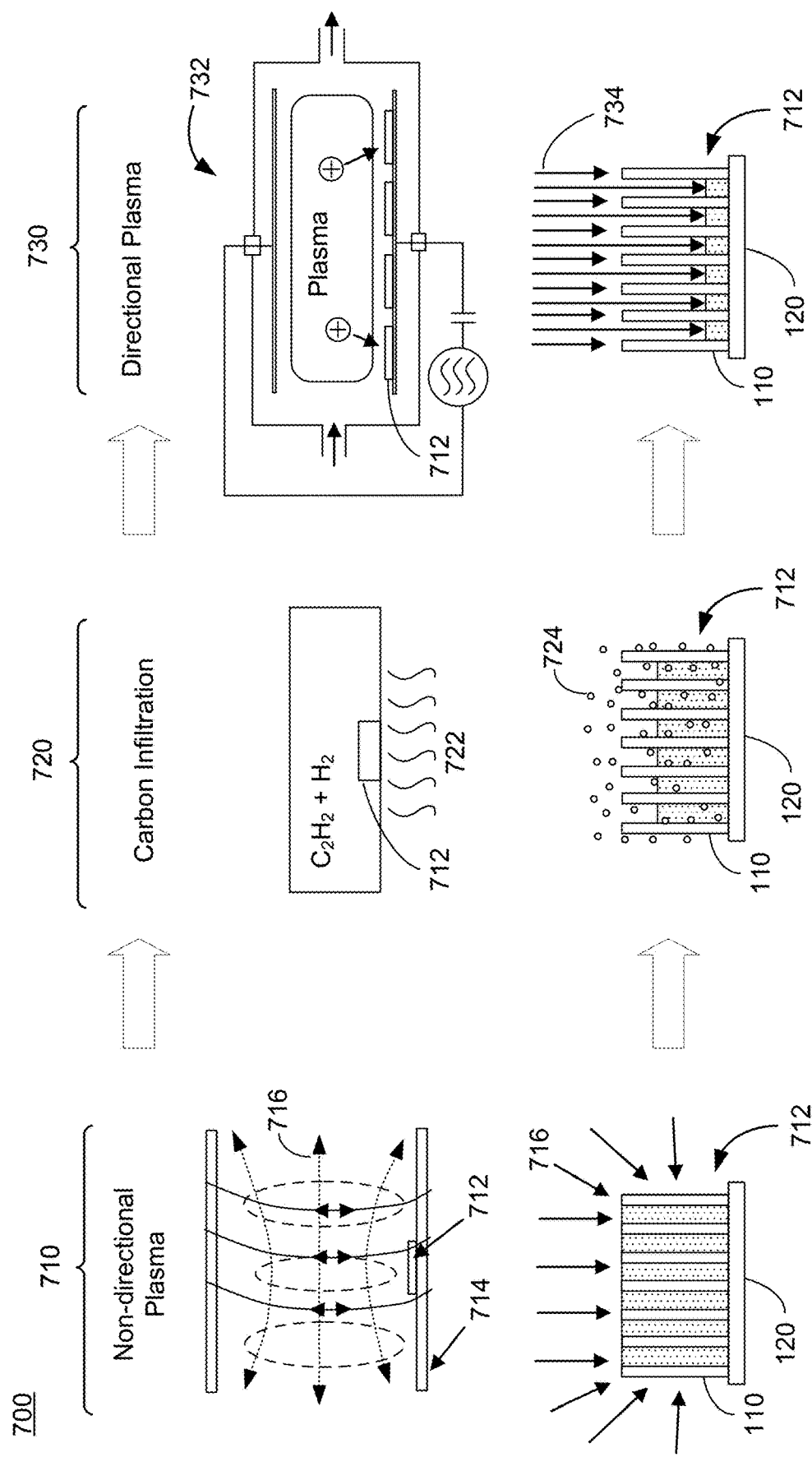
FIG. 7 is a diagram that illustrates a method for removal of supporting structures from an array of high aspect ratio CNT structures, according to an implementation.

In some implementations, such free standing mm-tall CNT posts can be produced by removing the sacrificial supporting CNT structures by, for example, a combination of non-directional plasma etching, carbon infiltration, and followed directional plasma etching, such as illustrated by and described with respect to FIG. 7.

In some implementations, a sacrificial structure or connector, such as the supporting structures 120, can be used to link pattern features (CNT posts) together during growth of a CNT pattern. In some implementations, the linked features can, during growth, be constrained by their connection to remain in a vertical (substantially vertical) orientation. In some implementations, this sacrificial feature can then be removed, leaving the desired feature(s), such as CNT posts, behind.

In some implementations, the supporting structure features can be sufficiently robust to constrain the growth (supporting structure features with widths as small as 1 um can be sufficient) and can be removed without damaging the final intended structure.

In some implementations, straight millimeter-tall CNT post arrays, such as shown in FIG. 1, can be directly grown with a sacrificial CNT supporting structure. In such implementations, a process that includes non-directional plasma etching, carbon infiltration, and directional plasma etching can be used to remove the sacrificial CNT structures.

Accordingly, the fabrication of high aspect ratio free standing straight CNT post arrays can be realized.

In some implementations, such nanotube posts can be nanotube posts that include nanotubes including materials other than carbon. For instance, a layer of silicon could be deposited on a CNT post (or array of CNT posts). After depositing the silicon layer, the CNT post(s) could be oxidized to convert the deposited silicon to silicon dioxide ($SiO_2$ or silica) and also convert the carbon of the CNTs to carbon dioxide (which can be vent out of an oxidation furnace), resulting in a nanotube post (or posts) that include silica nanotubes.

Figure 2D:
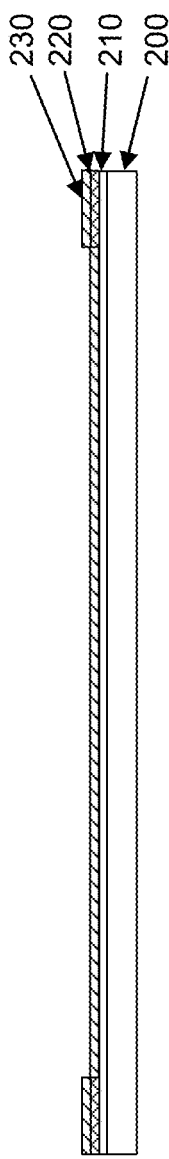

FIGS. 2A through 2G are cross-sections illustrating a processing flow for producing high aspect ratio CNTs, according to an implementation. In some implementations, as shown in FIG. 2A, a substrate can be prepared. The substrate can include, for example, a Si wafer 200 having a buffer layer 210 disposed (formed, deposited, etc.) thereon. In this implementation, the buffer layer 210, which can be an aluminum oxide ($Al_2O_3$) layer, can prevent diffusion of a catalyst for CNT growth from diffusing into the Si wafer 200. In other implementations, other substrate materials can be used, such as metal or glass substrates.

Figure 2E:
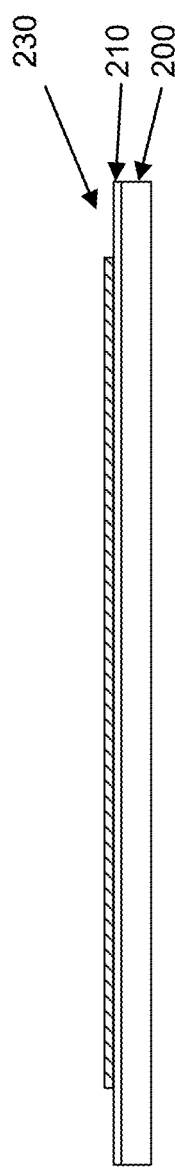
Figure 2F:
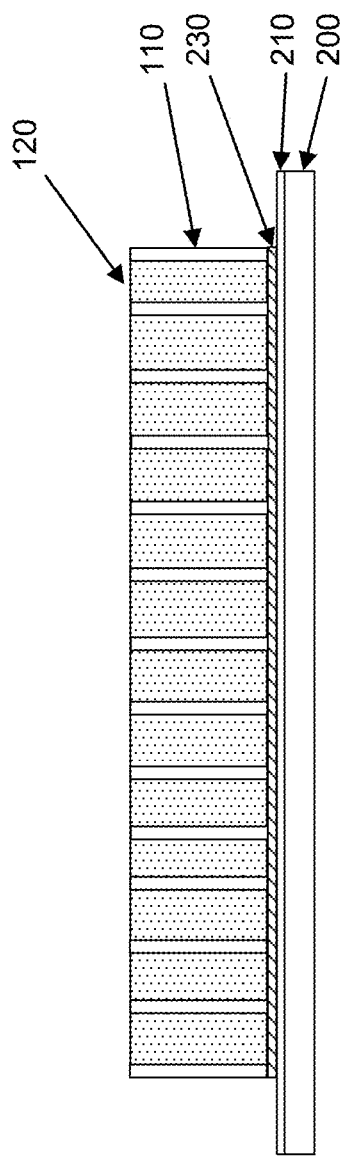

As shown in FIGS. 2B-2E, photolithography can then be performed to form a patterned catalyst layer 230, which can be an iron (Fe) layer. As shown in FIG. 2B, a photoresist layer 220 can be formed on the buffer layer 210. The photoresist layer can then be patterned as shown in FIG. 2C to define areas of the buffer layer 210 where the patterned catalyst layer 230 will be formed. In an implementation, the patterned catalyst layer 230 can have a pattern such as the pattern of CNT posts 110 and supporting structures 120 shown in FIG. 1. In other implementations, other patterns can be formed. As shown in FIG. 2D a catalyst material (e.g., Fe) can be deposited and, as illustrated by FIG. 2E, an lift-off process can be performed to remove unwanted catalyst material and underlying photoresist 220.

As shown in FIG. 2E, chemical vapor deposition (CVD) can be performed to grow CNT posts 110 with supporting structures 120. In an example implementation, CNT growth can be performed in, for example, a tube furnace. In such an approach, the structure shown in FIG. 2E can be placed in the furnace and hydrogen gas can flow over the sample as the furnace is heated to a desired temperature (750 C in one implementation). This hydrogen flow can reduce any oxide that may have formed on the catalyst layer 230 (and prevent formation of additional oxide). After the temperature of the furnace arrives at the desired temperature, carbon nanotubes (e.g., substantially vertical carbon nanotubes) can be grown by adding a flow of ethylene gas to the hydrogen flow for a given growth time, where the growth time depends on the desired height (aspect ratio) of the CNT structures being formed. Carbon nanotube growth can then be terminated by replacing the flows of hydrogen and ethylene with an inert gas flow (e.g., an argon flow) to flush the furnace chamber and halt carbon nanotube growth.

After CNT growth to form the CNT posts 110 and the interconnecting supporting structures 120, the supporting structures 120 can be removed, as shown in FIG. 2G. In an implementation, the supporting structures 120 can be removed used a combination of non-directional and directional plasma etching, such in the process described below with respect to FIG. 7.

Figure 3:
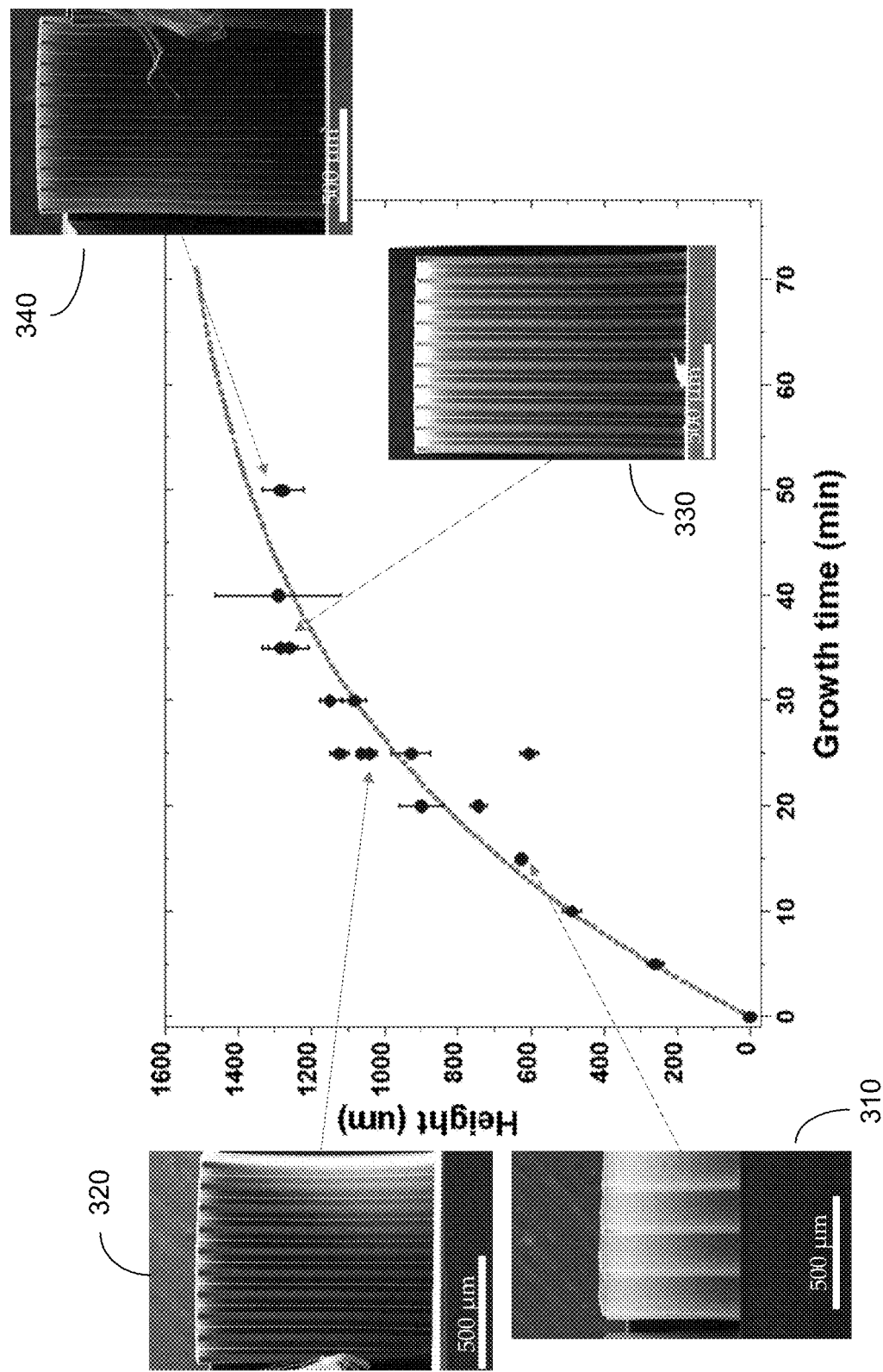
FIG. 3 is a diagram illustrating growth kinetic results for producing tall CNT features, on the order of millimeters, according to an implementation.

FIG. 3 is a diagram illustrating growth kinetic results (e.g., using the growth process described above) for producing tall CNT features, on the order of millimeters in height, according to an implementation. FIG. 3 includes scanning electron microscope (SEM) images 310, 320, 330 and 340 of CNT features at various growth times, as are respectively indicated with references to the graph for each image.

Figure 4A:
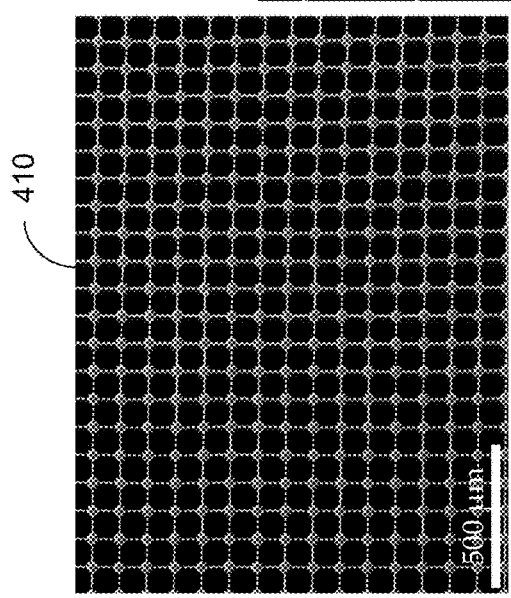
FIGS. 4A through 4C are images that illustrate top views of high aspect ratio CNT structures formed using supporting structures, according to implementations.
Figure 4B:
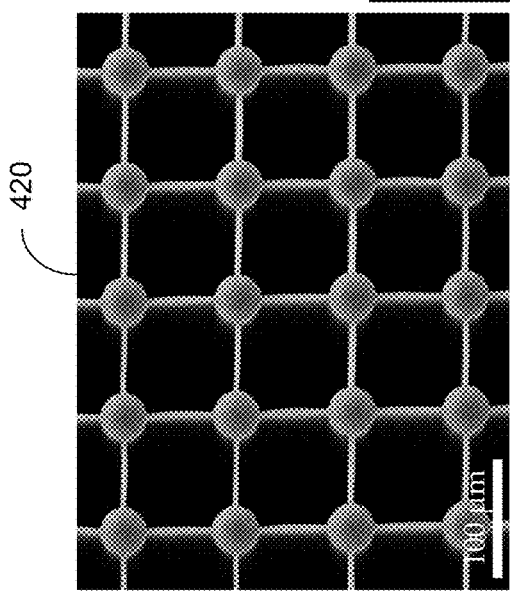
Figure 4C:
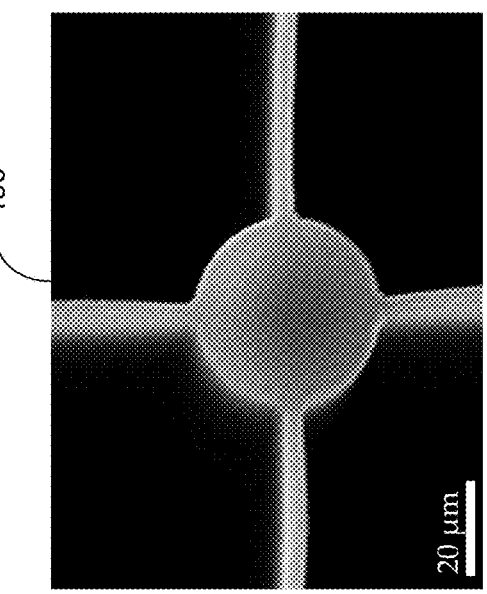

FIGS. 4A through 4C are SEM images 410, 420 and 430 that illustrate top views of high aspect ratio CNT structures formed using supporting structures at various magnifications, according to implementations. As shown, in some implementations, CNT posts (with supporting structures) that are well-ordered (e.g., regularly spaced/arranged, substantially vertical, etc.) can be achieved using the approaches described herein.

FIGS. 5A through 5C are SEM images 510, 520 and 530 (at various magnifications) that illustrate perspective views of tall CNT structures formed using supporting structures, according to implementations. In comparison, FIGS. 5D through 5F are SEM images 540, 550 and 560 that illustrate tall CNT structures formed without the use of supporting structures. As shown in FIGS. 5D through 5F, such CNT structures bend in random directions, break, tip, etc.

FIGS. 6A through 6D are SEM images 610, 620, 630 and 640 (at various magnifications) that illustrate side views of tall CNT structures formed using supporting structures, according to implementations. These side view SEM images 610-640 illustrate straight (substantially straight, vertical, substantially vertical, etc.) mm-tall CNT posts producing using the approaches described herein.

In some implementations, removal of the sacrificial structure can be performed by plasma etching or some other form of removal. For example, FIG. 7 is a diagram that illustrates a processing method 700 for removal of supporting structures from an array of high aspect ratio CNT structures, according to an implementation. The combination of processes in the method 700 can be used to efficiently remove supporting structure with reproducible results.

In FIG. 7, the upper images of each processing operation illustrate a schematic view of the associated processing operation, while the lower images illustrate CNT structures during the associated processing operation. In the method 700, a two-step etch can be performed with a carbon infiltration process performed in between the two etch steps, where the carbon infiltration process can be used to strengthen the CNT structures.

As shown in FIG. 7 (after growth of the CNTs posts 110 and supporting structures 210), an initial etch process 710 can be performed. In an implementation, the etch 710 can be performed on a CNT structure 712 in, for example, a chamber 714 (e.g., a PYREX chamber), and can be performed using a non-directional (oxygen) plasma 716. In some implementations, the etch process 710 may remove (or substantially only remove) an upper portion of the supporting structures 120, and only remove the supporting structures 120 a few hundred micrometers down from the top of the supporting structures 120. A variety of conditions can be used to perform the etch process 710. These conditions can include RF power (e.g., in a range of 6-18 watts (W)) and air flow rate (e.g., 0-20 standard cubic centimeters per minute (sccm)). In the etch process 710, lower RF powers can increase processing time, while higher air flow rates can destroy alignment of a CNT post array structure. In an example implementation, the etch 710 can be performed using an RF power of 18 W and air flow rate less than 1 sccm.

In the method 700, after the etch 710, carbon infiltration 720 can be performed, which can link the CNTs together with carbon 724 to strengthen the final structures against tipping, breaking, etc. During carbon infiltration 720, the CNT structures 712 can be heated 722 to various temperatures (e.g., in a range 850-900 C). Further, carbon infiltration 720 can be performed using different reaction gas flow rates (e.g., with a gas flow of $C_2H_2$ and $H_2$) and different infiltration times. In some implementations, an amount carbon 724 that is infiltrated in the CNT structures can affect the amount of time needed to remove the carbon infiltrated supporting structures 120. In an example implementation, carbon infiltration 720 can be performed for 1.5 minutes at 900° C. or lower.

As shown in FIG. 7, after the carbon infiltration 720, a directional (oxygen) plasma etch process 730 can then be performed (e.g., in a plasma etch chamber 732) on the CNT structures 712 to remove the bottom (lower) portion of the sacrificial structure 120 (not removed by the etch process 710) using a directional plasma 734. In some implementations, the directional plasma etch process 730 can have improved performance at the bottom of the confined CNT features (structures) as compared to the non-directional plasma etch process 710. Different conditions can be used (varied) to perform the directional plasma etch process 730. These conditions can include a plasma power (e.g., in a range of 100-250 W), an oxygen flow rate and a pressure in the etch chamber. In an implementation, the directional plasma etch process 730 can be performed at a power of 150 W, an oxygen flow rate of 10 sccm, and a pressure of 500 mTorr.

In some implementations, the combination of a non-directional etch targeting the top down of supporting structures and a directional etch targeting the bottom up of supporting structure can be used on a wide variety of feature geometries.

In some implementations, a structure (e.g., a final structure) can be etched by the processes of the method 700, which can cause a reduction in dimensions of the final structure. Such reductions in dimension can be accounted for in an initial design of a desired (final) CNT structure (e.g., CNT post).

Figure 8B:
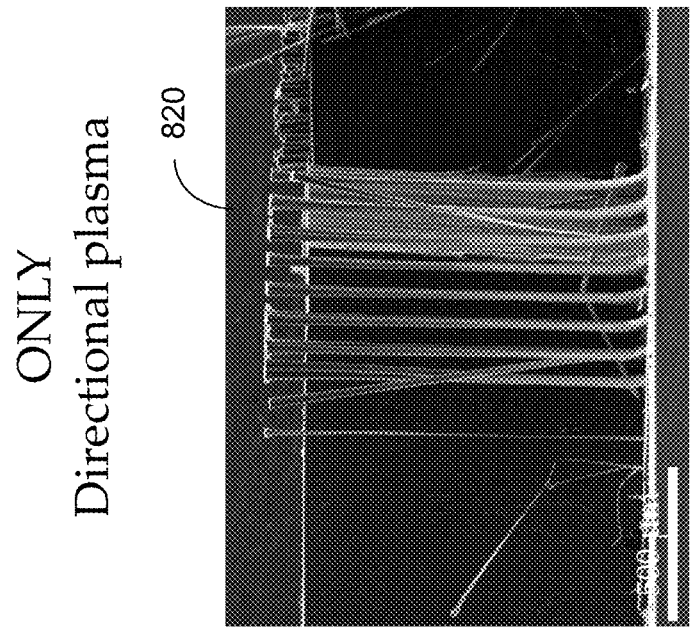
FIGS. 8A and 8B are images that illustrate aspects related to removal of supporting structures from an array of high aspect ratio CNT structures, according to implementations.
Figure 8A:
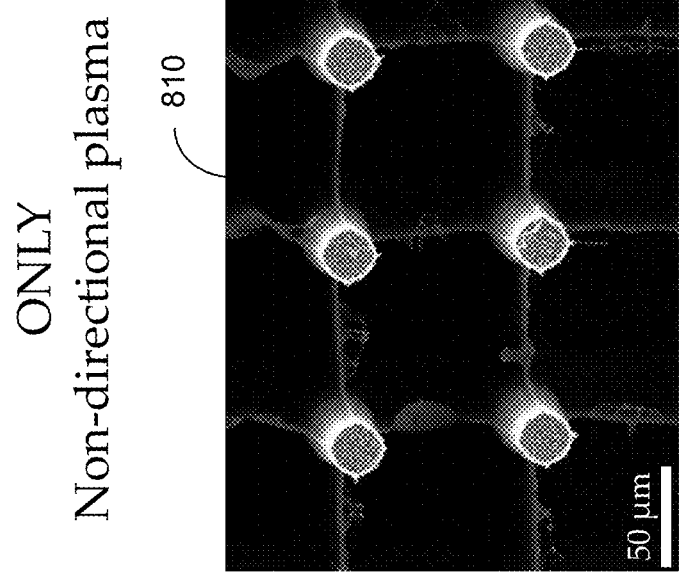

FIGS. 8A and 8B are SEM images 810 and 820 that illustrate aspects related to removal of supporting structures from an array of high aspect ratio CNT structures. The SEM image 810 in FIG. 8A illustrates a CNT structure where only non-directional plasma etching was used (as compared to the approach of FIG. 7). As shown in FIG. 8A, only upper portions of the supporting structures were removed after, for example, 5-10 hours of non-directional plasma etching. The SEM image 820 in FIG. 8B illustrates a CNT structure where only directional plasma etching was used (as compared to the approach of FIG. 7). As shown in FIG. 8B, using only directional plasma, CNT posts were damaged and/or lost vertical alignment.

Figure 9C:
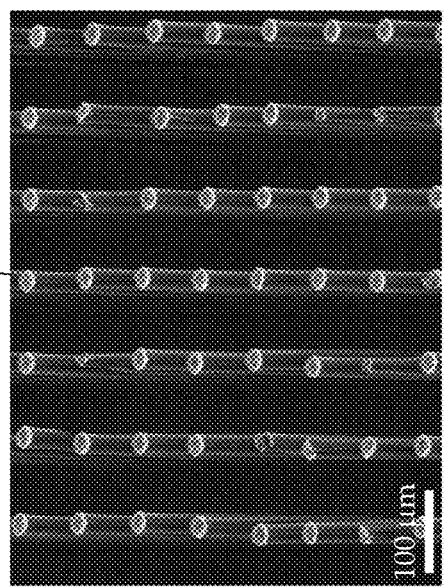
FIGS. 9A through 9E are images that illustrate free standing CNT posts after removal of supporting structures between the posts, according to implementations.
Figure 9B:
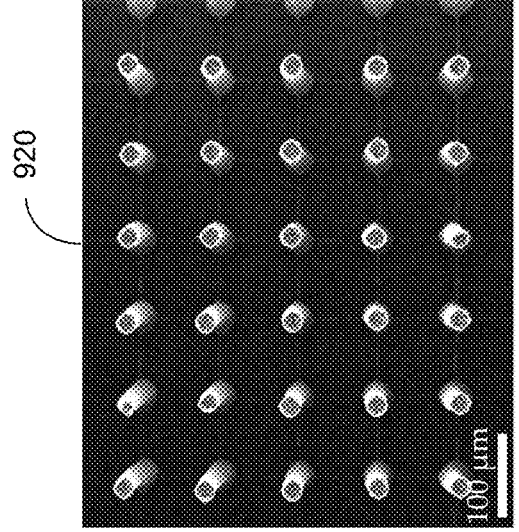
Figure 9A:
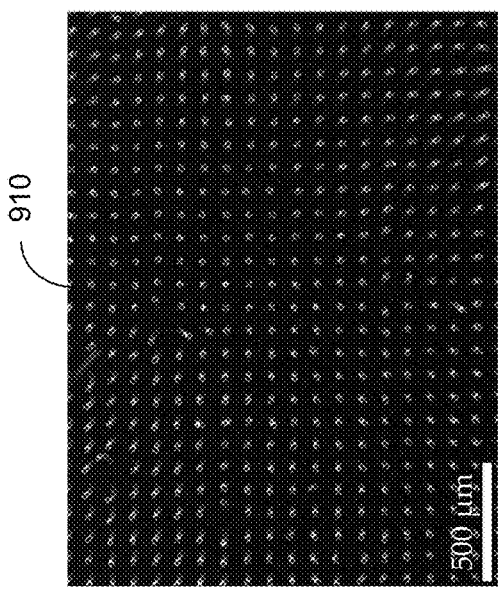
Figure 9E:
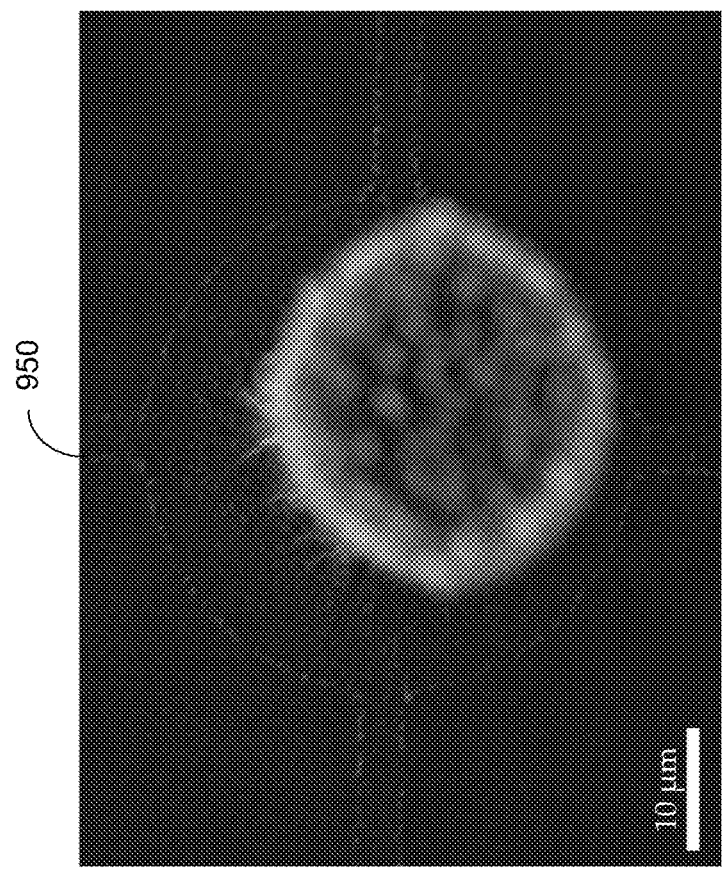
Figure 9D:
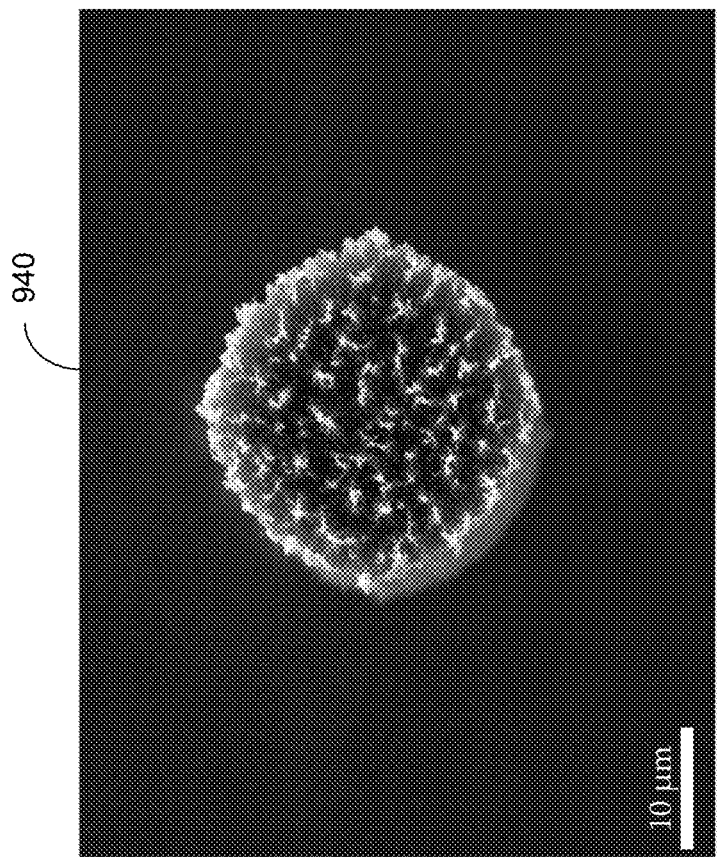

FIGS. 9A through 9E are SEM images 910, 920, 930, 940 and 950 that illustrate free standing CNT posts after removal of supporting structures between the posts (e.g. using the processing method 700 of FIG. 7), according to implementations. The SEM images 910-930 of FIGS. 9A-9C illustrate an array of CNT posts at various magnifications. The SEM images 940 and 950 of FIGS. 9D and 9E illustrate magnified images of a single CNT post. For instance, FIG. 9D shows a top of a CNT single post. FIG. 9E shows a bottom of a single CNT post, illustrating that a CNT supporting structures (such as those described herein) are removed with only some residue.

FIGS. 10A through 10D are SEM images 1010, 1020, 1030 and 1040 that illustrate (at various magnifications) side-views of free standing CNT posts (such as the CNT posts of FIGS. 9A-9E) after removing associated CNT supporting structures, according to implementations.

Figure 11:
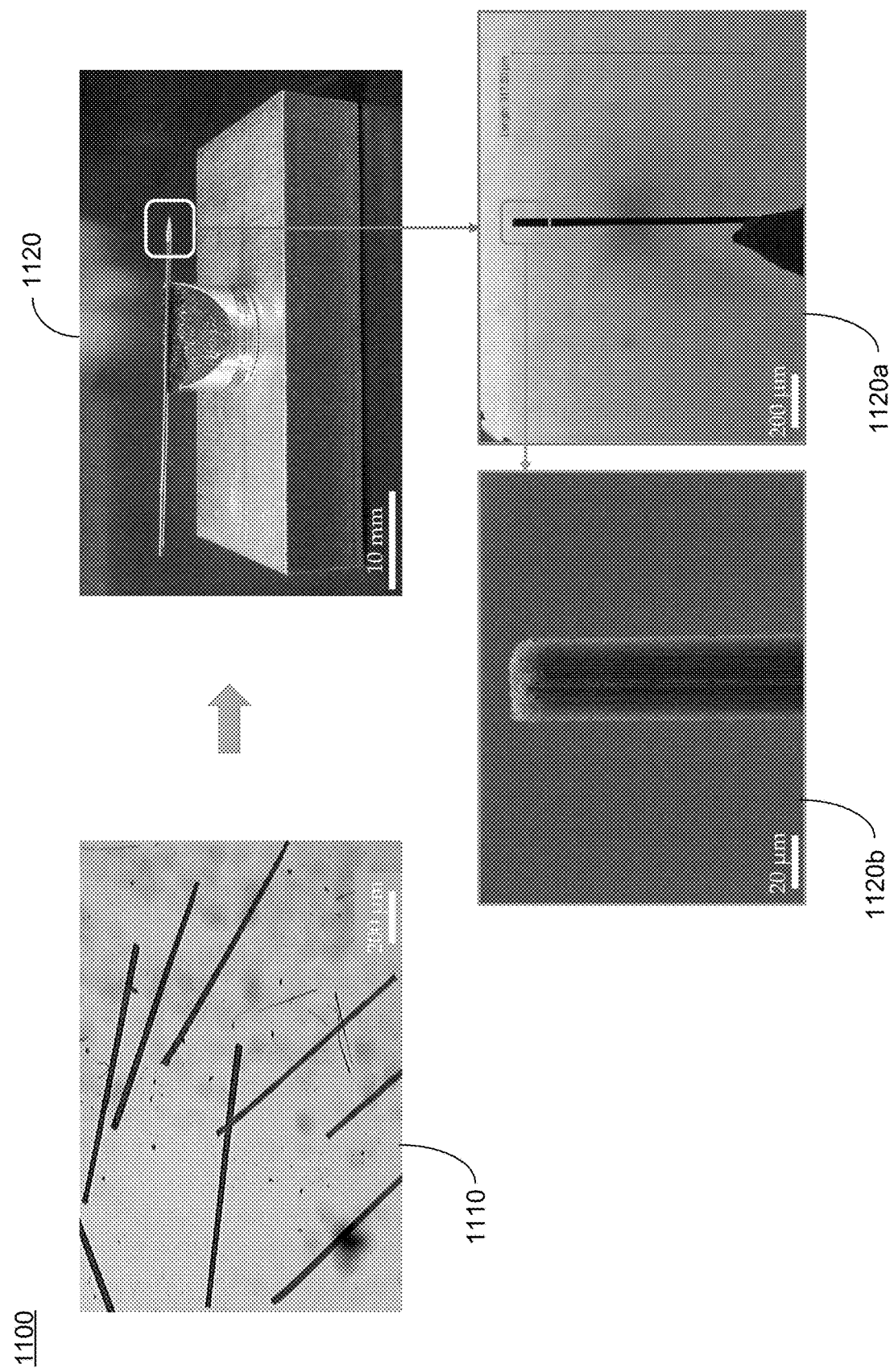
FIG. 11 is a diagram that illustrates transfer of free standing mm-tall CNT posts to, for example, a metal pin for further characterization, according to an implementation.

FIG. 11 is a diagram that illustrates transfer of free standing mm-tall CNT posts to, for example, a metal pin for further characterization, according to an implementation. In FIG. 11, an image 1110 illustrates CNT posts that have been removed from a substrate on which they were formed. An image 1120 in FIG. 11 illustrates a single CNT post (e.g., shown in the highlighted portion of the image 1120) attached to a metal pin. In FIG. 11, an image 1120a shows a magnified view of the CNT post attached to the metal pin and an image 1120b shows a portion of the CNT post that is highlighted in the image 1120a. The single CNT post shown in FIG. 11, or an array of CNT posts, can be used in a number of applications, such as for chemical sensing, use as neural probes, and so forth. Depending on the particular implementation, a CNT post, or array of CNT posts can be infiltrated with one or more materials. For example, CNT posts can be infiltrated with carbon, silicon, silicon nitride and/or plated with a metal, such as Ni or Cu.

Figure 12B:
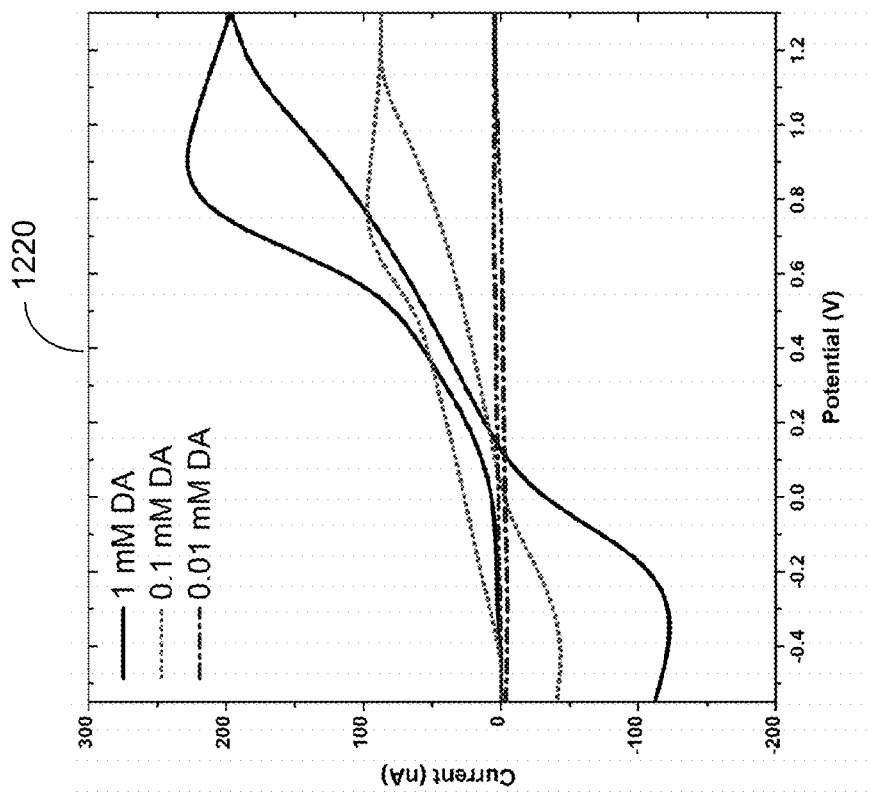
FIGS. 12A and 12B are graphs illustrating aspects of using mm-tall CNT posts in biochemical applications, according to an implementation.
Figure 12A:
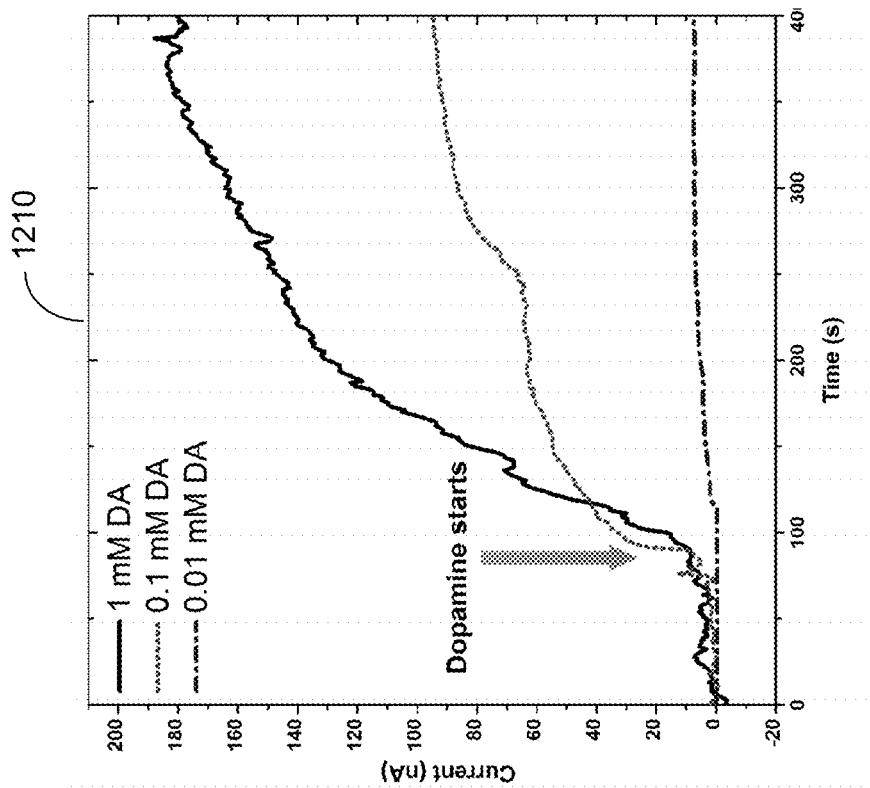

In an implementation, a CNT post array (such as those illustrated herein) can be used as a neural probe, for example, to detect dopamine. Such an implementation can aid in the production of medical implants used to improve the quality of life for people suffering from health conditions such as heart disease and neurological disorders. Such approaches could also be implemented using a single CNT post. FIGS. 12A and 12B are graphs illustrating use of a single CNT post (e.g. the CNT post of FIG. 11) as a probe for the detection of dopamine. In this example, a single CNT post (probe) was used to detected dopamine in concentrations from 10 micromoles to 1 millimole using fast scan rate (400 V/s) cyclic voltammetry.

As noted above, the results shown in FIGS. 12A and 12B were achieved using a single CNT post (e.g., such as shown in FIG. 11). In this implementation, the individual CNT post was affixed to a metal (e.g., tungsten) pin using a silver conducting paste. The metal pin and affixed CNT post were then coated with a layer of wax, which was followed by dipping a portion of the CNT post in xylene to expose that portion of the CNT post. This exposed part of the CNT post (probe) served as an electrode to perform electrochemical tests to detect the presence of dopamine.

FIG. 12A is a graph 1210 that illustrates current versus time curves indicating detection of dopamine, according to an implementation. FIG. 12B is graph 1220 that illustrates cyclic voltammetry curves for dopamine concentration s of 1, 0.1 and 0.01 millimoles in a phosphate-buffered saline (PBS) solution at a pH of 7.4. In the cyclic voltammetry test (illustrated by FIG. 12B), a voltage sweep from –0.6 V to 1.3 V was applied to the electrode (CNT probe) with a 1 Hz frequency and 400 V/s scan rate. Initially, a background current (shown in FIG. 12A from time 0 until dopamine introduction) was measured for a flow of PBS solution. Then, as shown in FIG. 12, dopamine started to flow (at approximately 90 seconds) and the electrode detected the presence of dopamine as a change in current due to the electrochemical reaction of dopamine in the PBS solution. As shown in FIG. 12A, the current increases as the concentration of dopamine increases relative to the concentration of the PBS solution. As the PBS solution is completely replaced by dopamine solution, the current plateaus, as illustrated in FIG. 12A, which also shows the gradual increase of the current for each dopamine concentration, and also demonstrates that the respective final current levels relate to the dopamine concentration.

FIG. 12B shows cyclic voltammetry curves used for dopamine detection (e.g., as shown in FIG. 12A) using the CNT probe described above at a scan rate of 400 V/s. In FIG. 12B, an oxidation peak of dopamine occurs at a potential of approximately 0.8 V. FIGS. 12A and 12B also illustrate that peak current is related to dopamine concentration. Using such an approach, measurement of dopamine concentration (or concentration of other substances) can be accomplished using CNT post (single posts or arrays) produced using the approaches described herein.

Further implementations are summarized in the following examples:

Example 1

An apparatus comprising: a substrate; and a post disposed on the substrate, the post including a plurality of nanotubes and extending substantially vertically from the substrate, the post having an aspect ratio of a height of the post to a diameter of the post of greater than or equal to 25:1.

Example 2

The apparatus of example 1, wherein the diameter of the post is in a range of 5 micrometers (μm) to 100 μm.

Example 3

The apparatus of example 1 or 2, wherein the post is substantially cylindrical.

Example 4

The apparatus of one of examples 1 to 3, wherein the height of the post is greater than or equal to 1 millimeter (mm).

Example 5

The apparatus of one of examples 1 to 4, wherein the plurality of nanotubes includes a plurality of carbon nanotubes (CNTs).

Example 6

The apparatus of one of examples 1 to 5, wherein at least a portion of the plurality of nanotubes of the post are infiltrated with carbon (C).

Example 7

The apparatus of one of examples 1 to 6, wherein at least a portion of the plurality of nanotubes of the post are infiltrated with at least one of silicon (Si) and silicon nitride (SiN).

Example 8

The apparatus of one of examples 1 to 7, wherein at least a portion of the plurality of nanotubes of the post are plated with a metal.

Example 9

The apparatus of one of examples 1 to 8, wherein the post is a first post, the apparatus further comprising a second post disposed on the substrate and laterally spaced from the first post, the second post including a plurality of nanotubes and extending substantially vertically from the substrate, the second post having an aspect ratio of a height of the second post to a diameter of the second post of greater than or equal to 25:1.

Example 10

The apparatus of one of examples 1 to 9, wherein the substrate includes a silicon (Si) wafer having an aluminum oxide ($Al_2O_3$) layer disposed thereon.

Example 11

A method comprising: providing a substrate; forming a patterned catalyst layer on the substrate, the patterned catalyst layer defining a template for carbon nanotube growth, the template defining a pattern for formation of: a first carbon nanotube post; a second carbon nanotube post; and a supporting structure disposed between the first carbon nanotube post and the second carbon nanotube post. The method further comprising growing carbon nanotubes on the patterned catalyst layer to form the first carbon nanotube post, the second carbon nanotube post and the supporting structure, the first carbon nanotube post and the second carbon nanotube post each having an aspect ratio of a height to a diameter of greater than or equal to 25:1, the supporting structure having an aspect ratio of a height to a width of greater than or equal to 200:1; and removing the supporting structure, such that each of the first carbon nanotube post and the second carbon nanotube post are freestanding and extend substantially vertically from the substrate.

Example 12

The method of example 11, wherein, prior to removal of the supporting structure, a height of the first carbon nanotube post, a height of the second carbon nanotube post and a height of the supporting structure are substantially a same height.

Example 13

The method of example 12, wherein the same height is greater than or equal to 1 millimeter (mm).

Example 14

The method of one of examples 11 to 13, further comprising infiltrating the first carbon nanotube post and the second carbon nanotube post with carbon (C).

Example 15

The method of one of examples 11 to 14, further comprising infiltrating the first carbon nanotube post and the second carbon nanotube post with at least one of silicon (Si) and silicon nitride (SiN).

Example 16

The method of one of examples 11 to 15, further comprising plating the first carbon nanotube post and the second carbon nanotube post with a metal.

Example 17

The method of one of examples 11 to 16, wherein removing the supporting structure includes: performing a non-directional plasma etch to remove an upper portion of the support structure, such that a lower portion of the support structure remains, the lower portion of the support structure being disposed on the substrate; infiltrating the first carbon nanotube post, the second carbon nanotube post and the lower portion of the support structure with carbon (C); and performing a directional plasma etch to remove the lower portion of the support structure.

Example 18

The method of one of examples 11 to 18, wherein the substrate includes a silicon (Si) wafer having an aluminum oxide ($Al_2O_3$) layer disposed thereon, the patterned catalyst layer being formed on the $Al_2O_3$ layer.

Example 19

The method of example 18, wherein forming the patterned catalyst layer includes forming, using photolithography, a patterned iron (Fe) layer, the $Al_2O_3$ layer preventing diffusion of the patterned Fe layer into the Si wafer.

Example 20

An apparatus comprising: a substrate; and an array of carbon nanotube posts disposed on the substrate, each carbon nanotube post of the array of carbon nanotube posts including a plurality of nanotubes and extending substantially vertically from the substrate, each carbon nanotube post of the array of carbon nanotube posts having an aspect ratio of a height of the post to a diameter of the post of greater than or equal to 25:1.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
   a substrate; and
   a micro-scale, free-standing post disposed on the substrate, the micro-scale, free-standng post having a height-to-diameter aspect ratio of greater than or equal to 25:1, the micro-scale, free-standing post including:
   a plurality of nanotubes, the micro-scale, free-standing post extending substantially vertically from the substrate; and
   an infiltration material that, over a height of the micro-scale, free-standing post, structurally links nanotubes of the plurality of nanotubes together.

2. The apparatus of claim 1, wherein a diameter of the micro-scale, free-standing post is in a range of 5 micrometers (μm) to 100 μm.

3. The apparatus of claim 1, wherein the micro-scale, free-standing post is substantially cylindrical.

4. The apparatus of claim 1, wherein a height of the micro-scale, free-standing post is greater than or equal to 1 millimeter (mm).

5. The apparatus of claim 1, wherein the plurality of nanotubes includes a plurality of carbon nanotubes (CNTs).

6. The apparatus of claim 1, wherein the infiltration material includes carbon (C).

7. The apparatus of claim 1, wherein the infiltration material includes at least one of silicon (Si) or silicon nitride (SiN).

8. The apparatus of claim 1, wherein at least a portion of the plurality of nanotubes of the micro-scale, free-standing post are plated with a metal.

9. The apparatus of claim 1, wherein the micro-scale, free-standing post is a first micro-scale, free-standing post, the apparatus further comprising a second micro-scale, free-standing post disposed on the substrate and laterally spaced from the first micro-scale, free-standing post, the second micro-scale, free-standing post including a plurality of nanotubes and extending substantially vertically from the substrate, the second micro-scale, free-standing post having a height-to-diameter aspect ratio of greater than or equal to 25:1.

10. The apparatus of claim 1, wherein the substrate includes a silicon (Si) wafer having an aluminum oxide ($Al_2O_3$) layer disposed thereon.

11. A method comprising:
    providing a substrate;
    forming a patterned catalyst layer on the substrate, the patterned catalyst layer defining a template for carbon nanotube growth, the template defining a pattern for formation of:
    a first micro-scale carbon nanotube post;
    a second micro-scale carbon nanotube post; and
    a supporting structure disposed between the first micro-scale carbon nanotube post and the second micro-scale carbon nanotube post;
    growing carbon nanotubes on the patterned catalyst layer to form the first micro-scale carbon nanotube post, the second micro-scale carbon nanotube post and the supporting structure, the first micro-scale carbon nanotube post and the second micro-scale carbon nanotube post each having a height-to-diameter aspect ratio of greater than or equal to 25:1, the supporting structure having height-to-width aspect ratio of greater than or equal to 200:1;

infiltrating, over a height of the first micro-scale carbon nanotube post and the second micro-scale carbon nanotube post, carbon nanotubes of the first micro-scale carbon nanotube post and carbon nanotubes the second micro-scale carbon nanotube post with an infiltration material, the infiltration material:
- over the height of the first micro-scale carbon nanotube post, structurally linking carbon nanotubes of the first micro-scale carbon nanotube post together; and
- over the height of the second micro-scale carbon nanotube post, structurally linking carbon nanotubes of the second micro-scale carbon nanotube post together; and removing the supporting structure, such that each of the first micro-scale carbon nanotube post and the second micro-scale carbon nanotube post are free-standing and extend substantially vertically from the substrate.

12. The method of claim 11, wherein, prior to removal of the supporting structure, a height of the first micro-scale carbon nanotube post, a height of the second micro-scale carbon nanotube post and a height of the supporting structure are substantially a same height.

13. The method of claim 12, wherein the same height is greater than or equal to 1 millimeter (mm).

14. The method of claim 11, wherein the infiltration material includes carbon (C).

15. The method of claim 11, wherein the infiltration material includes at least one of silicon (Si) or silicon nitride (SiN).

16. The method of claim 11, further comprising plating the first micro-scale carbon nanotube post and the second micro-scale carbon nanotube post with a metal.

17. The method of claim 11, wherein removing the supporting structure includes:
performing a non-directional plasma etch to remove an upper portion of the supporting structure, such that a lower portion of the supporting structure remains, the lower portion of the supporting structure being disposed on the substrate;
infiltrating the first micro-scale carbon nanotube post, the second micro-scale carbon nanotube post and the lower portion of the supporting structure with carbon (C); and
performing a directional plasma etch to remove the lower portion of the supporting structure.

18. The method of claim 11, wherein the substrate includes a silicon (Si) wafer having an aluminum oxide ($Al_2O_3$) layer disposed thereon, the patterned catalyst layer being formed on the $Al_2O_3$ layer.

19. The method of claim 18, wherein forming the patterned catalyst layer includes forming, using photolithography, a patterned iron (Fe) layer, the $Al_2O_3$ layer preventing diffusion of the patterned Fe layer into the Si wafer.

20. An apparatus comprising:
a substrate; and
an array of micro-scale, free-standing carbon nanotube posts disposed on the substrate, each micro-scale, free-standing carbon nanotube post of the array of micro-scale, free-standing carbon nanotube posts including a plurality of nanotubes and extending substantially vertically from the substrate, each micro-scale, free-standing carbon nanotube post of the array of micro-scale, free-standing carbon nanotube posts having a height-to-diameter aspect ratio of greater than or equal to 25:1, each of the micro-scale, free-standing carbon nanotube posts including an infiltration material that, over a height of a micro-scale, free-standing post of the array of micro-scale, free-standing carbon nanotube posts, structurally links nanotubes of a respective plurality of nanotubes together.

* * * * *

UNITED STATES PATENT AND TRADEMARK OFFICE
CERTIFICATE OF CORRECTION

PATENT NO. : 10,921,279 B2
APPLICATION NO. : 15/299386
DATED : February 16, 2021
INVENTOR(S) : Chen et al.

Page 1 of 1

It is certified that error appears in the above-identified patent and that said Letters Patent is hereby corrected as shown below:

In the Claims

In Column 12, Claim 1, Line 13, delete "free-standng" and insert -- free-standing --, therefor.

Signed and Sealed this
Tenth Day of August, 2021

Drew Hirshfeld
*Performing the Functions and Duties of the
Under Secretary of Commerce for Intellectual Property and
Director of the United States Patent and Trademark Office*